(12) United States Patent
Dickey

(10) Patent No.: US 9,435,028 B2
(45) Date of Patent: Sep. 6, 2016

(54) PLASMA GENERATION FOR THIN FILM DEPOSITION ON FLEXIBLE SUBSTRATES

(71) Applicant: Eric R. Dickey, Portland, OR (US)

(72) Inventor: Eric R. Dickey, Portland, OR (US)

(73) Assignees: Lotus Applied Technology, LLC, Hillsboro, OR (US); Toppan Printing Co., Ltd., Tokyo (JP)

( * ) Notice: Subject to any disclaimer, the term of this patent is extended or adjusted under 35 U.S.C. 154(b) by 670 days.

(21) Appl. No.: 13/888,159

(22) Filed: May 6, 2013

(65) Prior Publication Data

US 2014/0329030 A1 Nov. 6, 2014

(51) Int. Cl.
*C23C 16/455* (2006.01)
*C23C 16/54* (2006.01)
*H01J 37/32* (2006.01)

(52) U.S. Cl.
CPC ... *C23C 16/45536* (2013.01); *C23C 16/45548* (2013.01); *C23C 16/45555* (2013.01); *C23C 16/545* (2013.01); *H01J 37/32027* (2013.01); *H01J 37/3277* (2013.01); *H01J 37/32091* (2013.01); *H01J 37/32357* (2013.01); *H01J 37/32449* (2013.01); *H01J 37/32513* (2013.01); *H01J 37/32541* (2013.01); *H01J 37/32568* (2013.01)

(58) Field of Classification Search
CPC . C23C 14/56; C23C 14/562; C23C 16/4488; C23C 16/45517; C23C 16/45536; C23C 16/45538; C23C 16/45548; C23C 16/45555; C23C 16/45591; C23C 16/509; C23C 16/545; H01J 37/32027; H01J 37/32091; H01J 37/32357; H01J 37/32403; H01J 37/32449; H01J 37/32513; H01J 37/32541; H01J 37/32559; H01J 37/32568; H01J 37/32596; H01J 37/3277

See application file for complete search history.

(56) References Cited

U.S. PATENT DOCUMENTS

| | | | |
|---|---|---|---|
| 3,959,104 A | * | 5/1976 | Fales ................. B29C 59/14 118/718 |
| 5,090,356 A | * | 2/1992 | Nath .................. C23C 16/545 118/718 |
| 5,106,474 A | | 4/1992 | Dickey et al. |
| 5,460,853 A | | 10/1995 | Hintz et al. |
| 5,484,473 A | | 1/1996 | Bontempi |
| 6,888,172 B2 | | 5/2005 | Ghosh |
| 7,264,850 B1 | | 9/2007 | Itoh et al. |
| 7,749,364 B2 | | 7/2010 | Hartig |
| 7,951,276 B2 | | 5/2011 | Donchev et al. |
| 8,083,911 B2 | | 12/2011 | Hanika et al. |
| 8,137,464 B2 | | 3/2012 | Dickey et al. |

(Continued)

OTHER PUBLICATIONS

PCT/US2014/036431, International Search Report and Written Opinion, Aug. 21, 2014.

*Primary Examiner* — Karla Moore
*Assistant Examiner* — Benjamin Kendall
(74) *Attorney, Agent, or Firm* — Stoel Rives LLP

(57) ABSTRACT

A system for depositing a thin film on a flexible substrate comprises a plurality of processing zones spaced apart by an isolation zone, a plasma generator for generating a plasma region proximal to a pathway along which the substrate travels, and a substrate transport mechanism for guiding the substrate back and forth between the processing zones so that the substrate is transported past and exposed to the plasma region when the system is in use.

18 Claims, 3 Drawing Sheets

(56) References Cited

U.S. PATENT DOCUMENTS

| | | | |
|---|---|---|---|
| 8,178,168 B2* | 5/2012 | O'Neill | B05D 1/62 427/487 |
| 8,202,366 B2 | 6/2012 | Dickey et al. | |
| 2002/0170496 A1* | 11/2002 | Ha | B05D 1/62 118/718 |
| 2003/0116281 A1* | 6/2003 | Herbert | H01J 37/32743 156/379.6 |
| 2003/0172873 A1 | 9/2003 | Fischer et al. | |
| 2003/0185982 A1* | 10/2003 | Schwarzenbach | C23C 16/503 427/255.28 |
| 2005/0172897 A1 | 8/2005 | Jansen | |
| 2005/0178330 A1* | 8/2005 | Goodwin | H05H 1/2406 118/723 E |
| 2005/0249875 A1 | 11/2005 | Sasaki et al. | |
| 2006/0118242 A1* | 6/2006 | Herbert | C23C 16/5096 156/345.43 |
| 2007/0137574 A1* | 6/2007 | Sichanugrist | C23C 16/24 118/723 E |
| 2007/0224348 A1* | 9/2007 | Dickey | C23C 16/545 427/248.1 |
| 2007/0281089 A1* | 12/2007 | Heller | C23C 16/45514 427/255.5 |
| 2008/0000768 A1 | 1/2008 | Stimson et al. | |
| 2008/0026162 A1 | 1/2008 | Dickey et al. | |
| 2008/0092814 A1 | 4/2008 | Yan et al. | |
| 2009/0321248 A1 | 12/2009 | Tousimis | |
| 2010/0181192 A1 | 7/2010 | Meyer | |
| 2010/0276283 A1 | 11/2010 | Muenz et al. | |
| 2011/0042347 A1 | 2/2011 | Korngold et al. | |
| 2011/0159204 A1* | 6/2011 | Dickey | C23C 16/40 427/539 |
| 2011/0256323 A1 | 10/2011 | Dickey et al. | |
| 2011/0258981 A1 | 10/2011 | Keidar et al. | |
| 2012/0171371 A1 | 7/2012 | Dickey et al. | |
| 2012/0192792 A1 | 8/2012 | Mahajani et al. | |
| 2012/0219708 A1 | 8/2012 | Dickey et al. | |

\* cited by examiner

PLASMA GENERATION FOR THIN FILM DEPOSITION ON FLEXIBLE SUBSTRATES

BACKGROUND

A plasma may be used to activate thin film deposition reactions, such as reactions used in plasma-assisted atomic layer deposition (ALD). In such processes, plasma uniformity may affect the deposition processes and/or the resulting film. Because it can be difficult to form a uniform plasma during processing if the size of the plasma is large (e.g., when the deposition substrate has a large surface area), it has been suggested that increasing the electrode size may help form uniform plasmas for larger substrates. However, increases in plasma current resulting from increases in the electrode surface area can lead to plasma breakdown, flickering, and extinction.

DETAILED DESCRIPTION OF PREFERRED EMBODIMENTS

Figure 1:
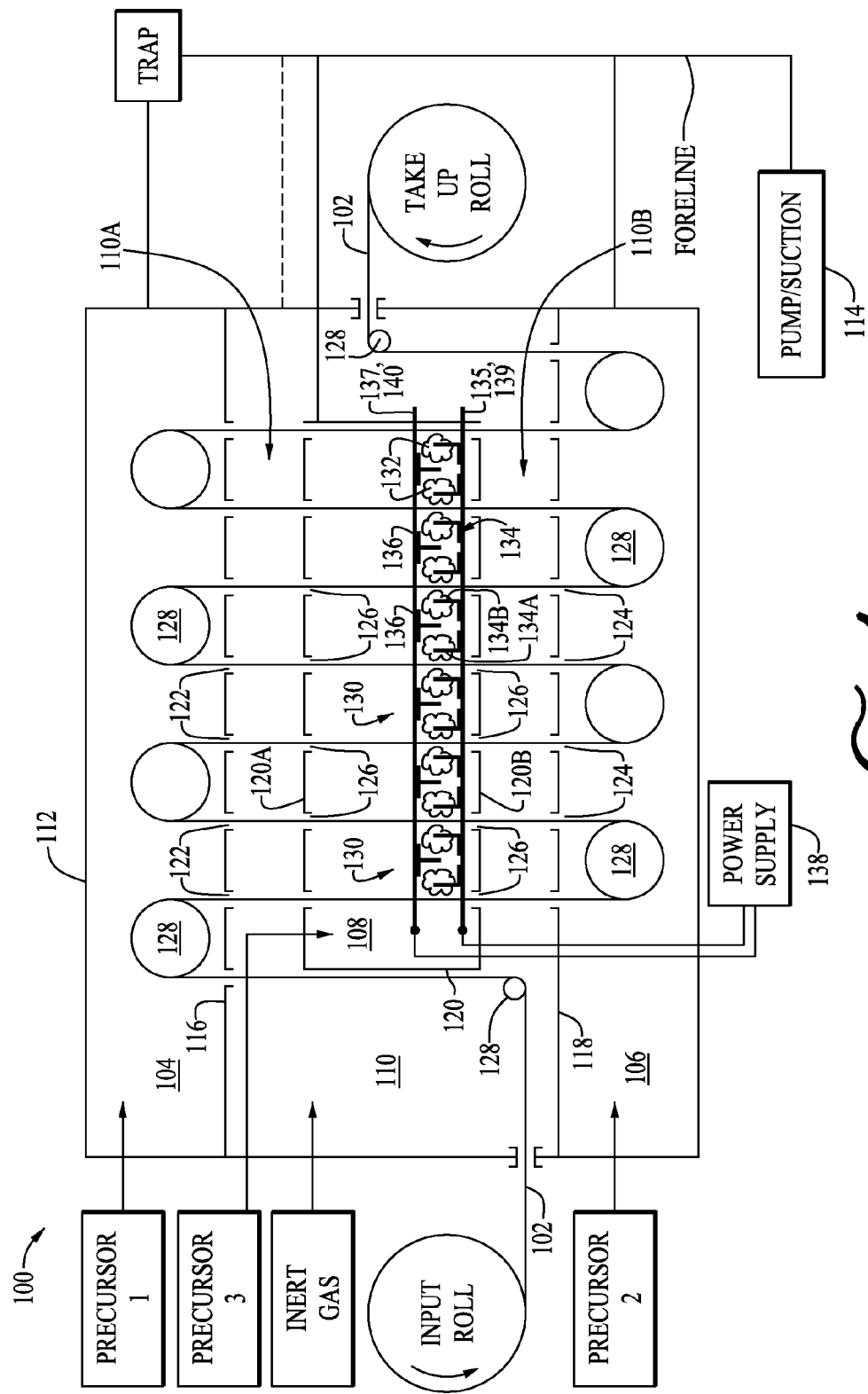
FIG. 1 schematically shows a cross-sectional view of a thin film deposition system according to an embodiment of the present disclosure.

FIG. 1 schematically illustrates a cross-sectional view of an embodiment of a thin film deposition system 100 for coating a substrate 102 (shown in profile in FIG. 1) with a flexible layer of material. In some embodiments, substrate 102 may be flexible, such as a web of plastic film or foil. Substrate 102 may be coated with a thin layer of material via vapor deposition, such as via atomic layer deposition (ALD). In contrast to chemical vapor deposition, in which the surface of a substrate is simultaneously exposed to precursor gases used to form the film, in ALD, the surface is exposed to individual precursors sequentially. For example, a first precursor vapor may be directed over the substrate so that precursor vapor chemisorbs to the surface. In a pure ALD process, chemisorption of the first precursor is self-limiting, as the precursor will not bond with other like molecules. After exposure to the first precursor, the substrate is exposed to a second precursor. Molecules of the second precursor chemisorb or otherwise react with the chemisorbed first precursor molecules to form a thin film product of the first and second precursors. In the embodiment shown in FIG. 1, thin film deposition system 100 includes first, second, and third precursor zones 104, 106, and 108, respectively, that are supplied with first, second, and third precursor gases (shown as Precursor 1, Precursor 2, and Precursor 3 in FIG. 1), respectively, when thin film deposition system 100 is in use. Thus, substrate 102 is exposed to a different precursor gas upon successive exposure to another precursor zone. For example, starting in first precursor zone 104, substrate 102 is exposed to Precursor 1; followed by exposure to Precursor 3 in third precursor zone 108; followed by exposure to Precursor 2 in second precursor zone 106; followed by exposure to Precursor 3 in third precursor zone 108; Precursor 1 in first precursor zone 104, and so on. Skilled persons will understand that systems including fewer than three precursor zones or four or more precursor zones may be configured to alternate or cyclically stage exposure of substrate 102 to a corresponding number of precursor gases.

Because one or more of the precursor gases may be sensitive or chemically reactive with another precursor gas, isolating or separating the precursor gases from one another during process may prevent particle-forming gas-phase reactions resulting from commingling of various precursor vapors. In the embodiment shown in FIG. 1, an isolation zone 110 separates first precursor zone 104, second precursor zone 106, and third precursor zone 108 from one another. Put another way, isolation zone 110 straddles third precursor zone 108 to create first and second isolation regions 110A, 110B on opposing top and bottom sides of third precursor zone 108. First and second isolation regions 110A and 110B need not be a part of a unitary isolation zone as shown in FIG. 1, but may correspond to separate isolation zones in some embodiments. Isolation zone 110 is supplied with an inert gas during use. Inert gases and the reactive precursor gases are, collectively, process gases, as these gases are introduced to a process environment of thin film deposition system 100 during processing of substrate processing or maintenance of thin film deposition system 100. An inert gas is a gas that is unreactive at the given process conditions. In contrast, a reactive gas will undergo chemical reaction under a given set of process conditions. For example, a precursor gas is reactive to form the flexible layer of material during processing. Skilled persons will understand that some inert gases may become reactive under process conditions that activate or excite the inert gas. Thus, an inert gas, when excited, may activate other reactive gases (e.g., precursor gases) or may itself become reactive as a precursor. Similarly, some reactive species may become inert or inactive in response to changes in process conditions.

In the embodiment shown in FIG. 1, the process environment is defined, bordered, and bounded by process vessel 112, which separates the process environment from the external ambient environment. Vessel 112 may comprise a pressure vessel and/or a vacuum vessel. In the embodiment shown in FIG. 1, vessel 112 fluidly communicates with a pump/suction source 114 so that the process environment may be adjustably controlled to and maintained at a subatmospheric pressure.

The process environment may also be subdivided into two or more subchambers. In the embodiment shown in FIG. 1, first and second precursor zones 104 and 106 and isolation zone 110 are separated from one another by first and second zone dividers 116 and 118, respectively, and isolation zone 110 is separated from third precursor zone 108 by a third zone divider 120, including spaced apart top and bottom divider portions 120A and 120B. In some other embodiments, additional zone dividers may separate the precursor zones and the isolation zone from one or more antechambers, such as a pre-deposition subchamber and/or a post-deposition subchamber (not shown).

A series of first passageways 122 through first divider 116 are spaced apart along a general direction of travel of substrate 102, and a corresponding series of second and third passageways 124, 126 are provided through second divider 118 and third dividers 120A and 120B. Passageways 122, 124, and 126 are arranged and configured so that substrate 102 traverses a pathway passing back and forth between first, second, and third precursor zones 104, 106, and 108, multiple times. In between successive exposures to two of the precursor zones, substrate 102 passes through isolation zone 110. For example, as substrate 102 traverses from first precursor zone 104 to second precursor zone 106, substrate 102 is transported from first precursor zone 104 through passageways 122 to first isolation region 110A, from first isolation region 110A through passageways 126 in top divider portion 120A to third precursor zone 108, from third precursor zone 108 through passageways 126 in bottom divider portion 120B to second isolation region 110B, and from second isolation region 110B through passageways 124 to second precursor zone 106. Turning guides 128 direct substrate 102 back in an opposite direction so that substrate 102 is transported from second precursor zone 106 back to second isolation region 110B, from second isolation region 110B to third precursor zone 108, from third precursor zone 108 to first isolation region 110A, and from first isolation region 110A to first precursor zone 104.

While the embodiment shown in FIG. 1 includes three precursor zones, it will be appreciated that some embodiments may include four or more precursor zones, and that some other embodiments may have fewer than three precursor zones. Regardless of the number of precursor zones contemplated, it is preferable that precursor zones supplied with precursor gases reactive with other gases in neighboring precursor zones be isolated from those zones by one or more isolation zones.

A plurality of plasma generators 130 are positioned within third precursor zone 108 in the example shown in FIG. 1, though it will be appreciated that plasma generators 130 may be located in any of the precursor zones and/or in isolation zone 110. During use, plasma generator 130 excites gas molecules by applying an electromagnetic field to a low pressure gas, ionizing the gas. For example, in some embodiments, total gas pressure in a processing zone containing plasma generators 130 may be about 1 Torr or greater, or in some other embodiments, about 2 Torr or greater. The free electrons are accelerated by the field, and if they collide with a gas molecule, may activate the molecule to form an excited state of the gas (e.g., radicals or ions, among others). Precursor gas excited by plasma generators 130 may react with previously adsorbed amounts of a different precursor (e.g., via ALD) to form a layer of film on the surface of substrate 102. For example, an aluminum oxide film may be formed by exposing substrate 102 to an aluminum-containing precursor (e.g., trimethylaluminum, or TMA) in first and second precursor zones 104 and 106 so that the aluminum-containing precursor chemisorbs to substrate 102. Subsequent exposure of substrate 102 to oxygen radicals generated with plasma generators 130 (e.g., via excitation of an oxygen-containing gas) in third precursor zone 108 leads to oxidation of the aluminum in the TMA chemisorbed to the substrate surface.

However, it may be difficult to strike (ignite) and/or stabilize a plasma when several electrodes are powered with a common power source. As the number of electrodes increases, current may flow unevenly among the electrodes. Uneven current distribution may lead to plasma instability or ignition failure at electrodes receiving comparatively less current. Accordingly, embodiments of thin film deposition systems including plasma generators having electrodes shaped and/or oriented to generate one or more plasma regions proximal to a pathway for a flexible substrate during use are disclosed herein. In some embodiments, portions of electrode surfaces formed from conductive materials may be coated or covered with comparatively less conductive or insulating materials that alter the shape of the plasma region formed nearby. Embodiments of methods for exposing a flexible substrate to a plasma region generated using such systems are also disclosed.

In the embodiment shown in FIG. 1, each plasma generator 130 generates a pair of plasma regions 132 primarily in an area where gases are excited by plasma generator 130. In some embodiments, one or more plasma regions 132 may extend toward the pathway so that the plasma gas contacts one or both surfaces of flexible substrate 102, permitting plasma generation to occur proximal to the exposed surface of substrate 102. As used herein, plasma region 132 refers to a region where gases are excited or activated. Excitation processes may involve excitation resulting from interaction with the field or excitation resulting from interaction with radicals or ions or both. Portions of a processing zone (third precursor zone 108, in the example shown in FIG. 1) outside of plasma region 132 are considered ambient regions of that zone if new active species are not generated therein. The size of plasma region 132 may vary based on the identity of gases, as skilled persons will understand that different gases may vary in sensitivity and susceptibility to the field and excitation by other ionized or radicalized species. Non-limiting examples of gases that may be excited by a plasma include argon, (Ar), helium (He), oxygen ($O_2$), carbon dioxide ($CO_2$), carbon monoxide (CO), nitrogen ($N_2$), nitrogen monoxide (NO), nitrous oxide ($N_2O$), nitrogen dioxide ($NO_2$), and mixtures thereof.

It will be appreciated that the shape and size of plasma regions 132 may also be affected by plasma generator power conditions (discussed below), total and partial pressure conditions near plasma generators 130 (discussed above), and/or sizes and locations of plasma generators 130 (discussed below). Thus, in some embodiments, two or more plasma generators 130 may contribute to and be enveloped by a common plasma region, even though the plasma regions 132 depicted in FIG. 1 appear discrete and separate. Further, while FIG. 1 shows plasma generators 130 adjacent bottom divider portion 120B, they may be positioned at any location within a processing zone. In some embodiments, plasma generators 130 may be positioned so that a portion of the processing zone bounded by plasma generators 130, which may be coextensive with or overlapped by one or more plasma regions 132, may extend primarily over an entirety of the zone (e.g., from one zone divider to another). In some other embodiments, the portion of a processing zone occupied by plasma generators 130 may be closer to one zone divider bordering the processing zone than another bordering that same zone (e.g., closer to bottom divider 120B as shown in FIG. 1), and in still other embodiments, the portion may be spaced apart from the zone dividers bordering the processing zone (e.g., in a middle of the processing zone).

In some embodiments, a glow discharge plasma may be generated by a field resulting from the application of a direct current (DC) potential difference between electrodes having complementary charges (e.g., between a negative electrode and a positive electrode, or between a negative electrode and a grounded electrode). In the embodiment shown in FIG. 1, plasma generators 130 each include first and second electrodes 134 and 136 having electrically conductive surfaces (e.g., aluminum surfaces) that are electrically isolated from one another. First and second electrodes 134 and 136 extend toward one another in vertically oriented planes paralleling a portion of the pathway along which substrate 102 travels. In turn, a surface of flexible substrate 102 is both transported past plasma regions 132 and exposed to excited species (e.g., radicals) generated from precursor gases. In the example shown in FIG. 1, the surface of flexible substrate 102 is exposed to radicals generated from Precursor 3.

First electrode 134 includes a pair of electrically connected first and second conductors 134A and 134B that are spaced apart from one another. In some embodiments, first and second conductors 134A and 134B may be spaced so that the vertical flange of each is about 0.5 inch from a pathway of substrate 102 during use. In some of such embodiments, the respective vertical flanges of conductors 134A and 134B may have a spacing pitch of about 1.5 inches. First and second conductors 134A and 134B each include a vertical flange held upright from underneath by a horizontal support in the embodiment shown in FIG. 1. The horizontal support rests on a first electrode support 135, which is depicted as being spaced apart from bottom divider portion 120B in the embodiment shown in FIG. 1, though in some embodiments first electrode support 135 may be supported by a zone divider. In some embodiments, one or both of the vertical flanges may include smooth, fin-shaped, flat plates. For example, the vertical flanges may be solid plates that are about 12.7 cm tall and about 28 cm deep. In some other embodiments one or both of the vertical flanges may include various protrusions extending from a vertical face of the flange, or openings or pass-throughs perforating the vertical flange (described in more detail below).

In the embodiment shown in FIG. 1, second electrode 136 has a T-shaped cross-section having a horizontal base and a vertical flange, though in some embodiments second electrode 136 may be L-shaped or have another cross-sectional shape. In the embodiment shown in FIG. 1, the horizontal base is supported by a second electrode support 137 positioned above second electrode 136. While FIG. 1 shows second electrode support 137 spaced apart from top divider portion 120A, in some embodiments, a zone divider may support second electrode support 137.

In some embodiments, the vertical flange of second electrode 136 may include a smooth flat plate positioned in a vertical plane, so that the flange has a vertical fin shape. For example, the vertical flange may be a solid plate that is about 12.7 cm tall and about 28 cm deep in some embodiments. In some other embodiments the vertical flange may include various protrusions extending horizontally from a vertical face of the flange, or openings or pass-throughs perforating the vertical flange.

As shown in FIG. 1, second electrode 136 is positioned between first and second conductors 134A and 134B and extends downwardly toward a space interposed therebetween. In some embodiments, one or both conductors 134A, 134B of first electrode 134 may be spaced apart from second electrode 136 by about 0.4 to 2.0 cm in a particular plasma generator 130. Put another way, second electrode 136 is positioned so that first conductor 134A is positioned between second electrode 136 and a portion of flexible substrate 102 traversing a first portion of the pathway, and so that second conductor 134B is positioned between second electrode 136 and another portion of flexible substrate 102 traversing a second portion of the pathway. In some embodiments, one or both conductors 134A, 134B may be positioned within 0.5 cm of flexible substrate 102. The field generated in the space between the first and second electrodes 134 and 136 by the different potentials ignites and stabilizes plasma gas within plasma region 132. In some embodiments, first and second conductors 134A and 134B may be spaced apart from one another by about 2.0 cm or more in a particular plasma generator 130.

The plurality of plasma generators 130 shown in FIG. 1 are powered by a common power supply 138, though in some embodiments groups of and/or individual plasma generators 130 may be powered by separate power supplies so that corresponding plasma regions 132 may be separately controlled (e.g., to provide zone control of plasma regions 132). In some embodiments, power supply 138 may include a direct current (DC) power supply for generating a glow discharge plasma. For example, a network of 25 plasma generators 130 powered by a single power supply 138 may be operated at a power of about 3.8 kilowatt (kW) or less, so that each plasma generator 130 is supplied with a power of about 150 Watts (W) or less. Some individual power supplies 138 rated up to 9 kW may be used to supply networks of plasma generators 130 with power.

In some embodiments power supply 138 may include a radio frequency (RF) generator and a capacitance matching network for generating a capacitively coupled plasma. In such embodiments, alternating current (AC) power is supplied to the electrodes, so that each electrode in a pair of electrically isolated electrodes acts as a cathode or an anode in alternation (e.g., acting as a cathode during one portion of a power cycle and later acting as an anode during another portion of the power cycle). In one example, power supply 138 may include an RF generator configured to operate at 13.56 megahertz (MHz), within an acceptable tolerance. In another example, power supply 138 may include a low-frequency RF generator configured to operate at 1 MHz or less, and in yet another example, at 40 kilohertz (kHz) or less, which may confine plasma region 132 within about 1 centimeter (cm) or less of exposed electrode surfaces. In some of such embodiments, power supply 138 may also be configured to simultaneously supply pulsed DC power in addition to AC power supplied by an RF generator.

First and second electrodes 134 and 136 are electrically isolated from one another by a space separating the electrodes at plasma region 132 and by suitable electrical insulators elsewhere (not shown). In the embodiment shown in FIG. 1, all first electrodes 134 are electrically connected to one another and with a first pole of power supply 138 via a first electrode bus 139, so that all first electrodes 134 may have the same electrical potential, within an acceptable tolerance. Likewise, all second electrodes 136 are electrically connected to one another and with a different pole of power supply 138 via a second electrode bus 140 in the embodiment shown in FIG. 1. For example, in embodiments where power supply 138 includes a DC power supply, connecting first electrodes 134 with a positive pole of power supply 138 and second electrodes 136 with a negative pole of power supply 138 will cause first electrodes 134 to act as anodes and second electrodes 136 to act as cathodes. Of course, in still other embodiments, first electrodes 134 may be electrically connected with a negative pole of power supply 138 and second electrodes 136 may be electrically connected with either a positive pole of power supply 138 or a suitable ground connection so that first electrodes 134 act as cathodes and second electrodes 136 act as anodes.

Figure 2:
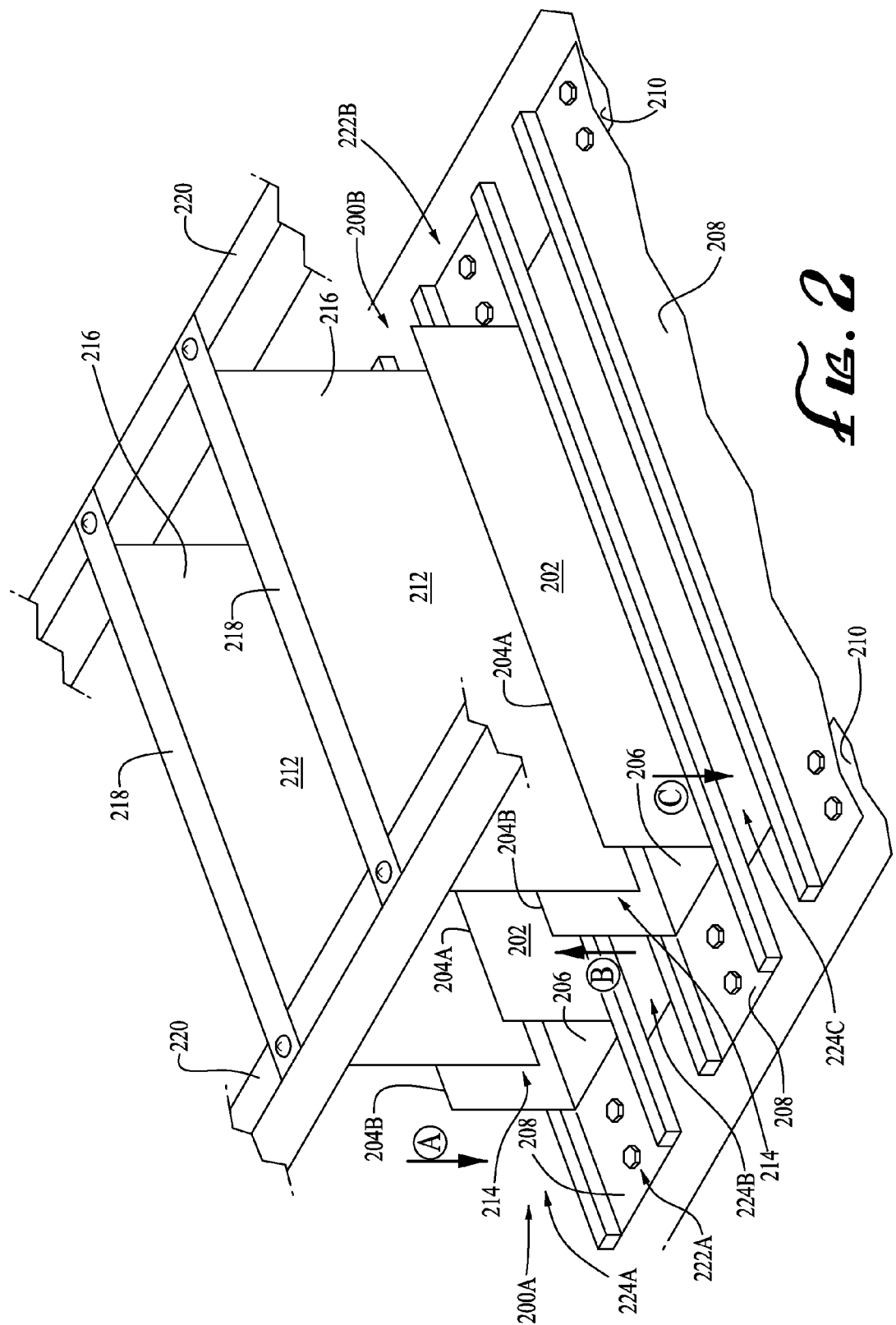
FIG. 2 shows a perspective view of a plurality of electrodes according to an embodiment of the present disclosure.

In some embodiments, the horizontal support surfaces of first and second conductors 134A and 134B may be joined as a web portion to form a channel-shaped electrode. FIG. 2 shows a perspective view of an embodiment of a plurality of plasma generators shown as 200A and 200B. Plasma generators 200A and 200B each include a channel-shaped electrode 202 formed from a pair of flanges 204A and 204B joined by a web portion 206. In some embodiments, flanges 204A and 204B may be spaced apart from one another by 2.0 cm or more. In some embodiments, flanges 204A and 204B may include smooth, flat plates that are about 12.7 cm tall and about 28 cm deep. In some other embodiments, one or both of flanges 204A and 204B may include various protrusions extending from a vertical face of the flanges, or openings or pass-throughs perforating the flanges (described in detail below).

In the embodiment shown in FIG. 2, web portion 206 is supported by a zone divider 208, though in some embodiments channel-shaped electrode 202 may be supported by a first electrode support positioned away from zone divider 208. Further, in some embodiments, channel-shaped electrode 202 may be supported at one or both flanges 204A, 204B. In the embodiment shown in FIG. 2, zone divider 208 electrically connects channel-shaped electrode 202 with a first electrode bus 210. Alternatively, in some embodiments, channel-shaped electrode 202 may be electrically connected with and/or supported by a dedicated electrode support positioned away from zone divider 208. In an example where channel-shaped electrode 202 acts as an anode, first electrode bus 210 is electrically connected to either one of a ground or with a positive pole of power supply 138 (FIG. 1).

FIG. 2 also shows a cantilevered electrode 212 that extends toward web portion 206 so that a space 214 formed between flanges 204A and 204B is interposed between web portion 206 and cantilevered electrode 212. In some embodiments, cantilevered electrode 212 may be spaced apart from one or both flanges 204A and 204B by between 0.4 and 2.0 cm.

In the embodiment shown in FIG. 2, cantilevered electrode 212 has an L-shaped cross-section, including a vertical flange 216 and horizontal base 218. In some embodiments, vertical flange 216 of cantilevered electrode 212 may include a smooth flat plate, so that the flange 216 has a vertical fin shape. For example, vertical flange 216 may be a solid plate that is about 12.7 cm tall and about 28 cm deep in some embodiments. In some other embodiments vertical flange 216 may include various protrusions extending horizontally from a vertical face of flange 216, or openings or pass-throughs perforating vertical flange 216. In the embodiment shown in FIG. 2, vertical flange 216 is supported by a horizontal base 218 from a second electrode bus 220. In an example where cantilevered electrode 212 acts as a cathode, second electrode bus 220 is in electrical communication with a negative pole of power supply 138.

In the embodiment shown in FIG. 2, plasma generators 200A and 200B are interposed in gaps (shown at 222A and 222B) formed between passageways through which flexible substrate 102 (FIG. 1) travels along the pathway during processing, so that flexible substrate 102 travels past one or both of flanges 204A and 204B and a plasma region 132 (FIG. 1) formed thereby. In some embodiments, one or both flanges 204A, 204B for a particular plasma generator may be positioned within 0.5 cm of flexible substrate 102. For reference, directional arrows labeled 'A,' 'B,' and 'C' indicate the direction of substrate travel along the portions of the pathway shown in FIG. 2. In the example shown in FIG. 2, plasma generator 200A is positioned in a first gap 222A formed between a first flow-restricting passageway 224A and a second flow-restricting passageway 224B. Specifically, plasma generator 200 is positioned so that flange 204B is positioned between cantilevered electrode 212 and a portion of flexible substrate 102 downwardly traversing a first portion of the pathway at 'A,' and flange 204A is positioned between cantilevered electrode 212 and a portion of flexible substrate 102 upwardly traversing a first portion of the pathway at 'B.' Similarly, plasma generator 200B is positioned in a second gap 222B formed between the second flow-restricting passageway 224B and a third flow-restricting passageway 224C. Consequently, flange 204B of plasma generator 200B is positioned between cantilevered electrode 212 and a portion of flexible substrate 102 upwardly traversing a first portion of the pathway at 'B,' and flange 204A of plasma generator 200B is positioned between cantilevered electrode 212 and a portion of flexible substrate 102 downwardly traversing a first portion of the pathway at 'C.' The arrangement of plasma generators shown in FIG. 2 will cause both sides of substrate 102 to be exposed to plasma region 132 during processing. Alternatively, in some embodiments, omitting a plasma generator from every other gap (that is, positioning plasma generators in alternation with generator-free gaps) may lead to just a single side of substrate 102 being exposed to plasma region 132 during processing. Of course, in still other embodiments, plasma generators may be selectively positioned along zone divider 108 to alter plasma exposure conditions to one or both surfaces of substrate 102 during successive trips through the processing zone including the plasma generators.

Figure 3:
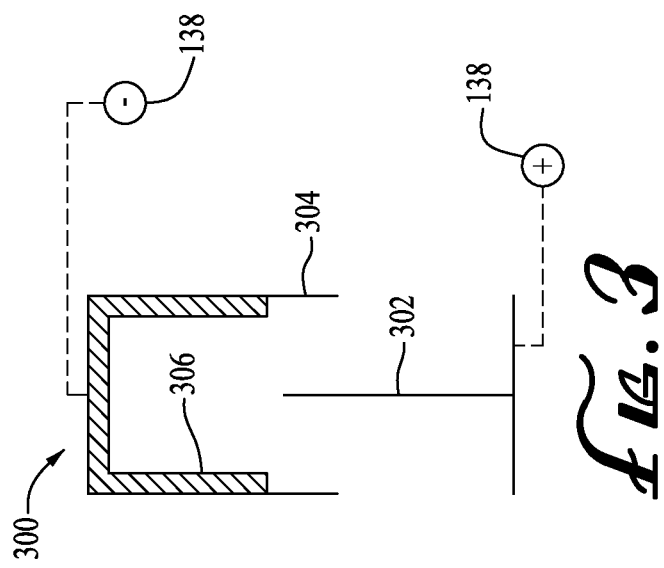
FIG. 3 schematically shows a cross-sectional view of another embodiment of a plasma generator including an example insulating material according to the present disclosure.

In some embodiments, one or more plasma generators 130 may include a layer of an insulating material coated, bonded, or adhered to one or more conductive surfaces of one or more electrodes. For example, an insulating metal or nonmetal oxide, or both, may be deposited on an aluminum electrode to form an insulating layer thereon. In another example, an insulating polymer material (e.g., a polyimide film) may be coated or adhered (e.g., via a self-adhesive tape, such as a self-adhesive polyimide tape sold under the tradename KAPTON by E. I. du Pont de Nemours and Co.) to form an insulating layer on an aluminum electrode. Where present, the insulating material blocks current flow, preventing the formation and stabilization of a plasma nearby. For example, FIG. 3 schematically shows a side cross-section of an embodiment of a plasma generator 300. Plasma generator 300 includes a cantilevered anode 302 electrically connected with a positive pole of power supply 138 and a channel-shaped cathode 304 electrically connected with a negative pole of power supply 138. Channel-shaped cathode 304 also includes an insulating layer 306 coating surfaces of the web portion and some portions of the flanges that face inwardly (e.g., toward the space into which anode 302 extends). The plasma will not extend into the region between the flanges shielded by insulating material 306 during use. In turn, current will flow elsewhere, potentially enlarging the plasma region near outer surfaces of cathode 304 and/or anode 302 so that additional plasma gas contacts substrate 102 (FIG. 1).

Figure 4:
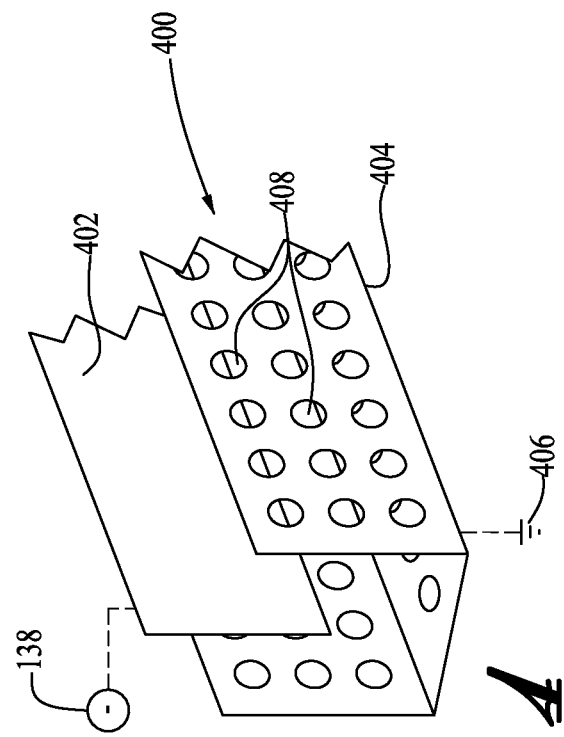
FIG. 4 schematically shows a cross-sectional view of another embodiment of a plasma generator including an example plasma pass-through according to the present disclosure.

Transfer of plasma gas toward substrate 102 may also be enhanced in some embodiments by using electrodes that include plasma pass-through openings. For example, FIG. 4 schematically shows a side cross-section of an embodiment of a plasma generator 400 including a cantilevered cathode 402 electrically connected with a negative pole of power supply 138 and a channel-shaped anode 404 electrically connected with a ground 406. Channel-shaped anode 404 includes a plurality of plasma gas distribution pass-through openings 408 that permit gas flow between cantilevered electrode 402 and substrate 102 (FIG. 1). Non-limiting examples of plasma gas distribution pass-through openings include perforations, screens, meshes and other structures with openings.

It will be obvious to those having skill in the art that many changes may be made to the details of the above-described embodiments without departing from the underlying principles of the invention. The scope of the present invention should, therefore, be determined only by the following claims.

The invention claimed is:

1. A system for depositing a thin film on a flexible substrate, comprising:
   a first zone supplied with a first precursor gas when the system is in use;
   a second zone supplied with a second precursor gas when the system is in use;
   a third zone supplied with a third precursor gas when the system is in use, the third zone including a series of flow-restricting passageways opening into the first zone and second zone and arranged to provide a pathway along which a flexible substrate is threaded so that, when the system is in use, the flexible substrate is exposed to the first precursor gas in the first zone, the second precursor gas in the second zone, and the third precursor gas in the third zone;
   a plasma generator positioned in a gap formed between adjacent flow restricting passageways along the pathway within the third zone to generate radicals, using the third precursor gas, that are reactive with an amount of the first precursor gas, the second precursor gas, or combinations thereof, that is adsorbed to the flexible substrate upon exposure of the substrate to the first precursor zone and second precursor zone, respectively, the radicals being generated in a plasma region proximal to the plasma generator, the plasma generator including:
      a channel-shaped electrode formed from a pair of flanges joined by a web portion, and
      a cantilevered electrode that extends toward the web portion so that a space formed between the flanges is interposed between the web portion and the cantilevered electrode,
      wherein the channel-shaped electrode and the cantilevered electrode extend toward one another in planes paralleling adjacent portions of the pathway along which the flexible substrate is threaded when the system is in use;
   a power supply electrically connected with the plasma generator; and
   a substrate transport mechanism adapted to guide the flexible substrate back and forth via a plurality of turning guides, at least some of which are located in the first and second zones, between the first and second zones along the pathway and through the series of flow-restricting passageways so that a surface of the flexible substrate is transported past the plasma region and exposed to the radicals when the system is in use.

2. The system of claim 1, where one of the channel-shaped electrode or the cantilevered electrode functions as an anode and where the other of the channel-shaped electrode or the cantilevered electrode functions as a cathode when the system is in use.

3. The system of claim 1, where one of the channel-shaped electrode or the cantilevered electrode is electrically grounded when the system is in use.

4. The system of claim 1, further comprising a second plasma generator positioned within the third zone, the second plasma generator including:
   a second channel-shaped electrode interposed in a second gap between a second flow-restricting passageway and a third flow-restricting passageway, the second channel-shaped electrode being formed from a second pair of flanges joined by a second web portion; and
   a second cantilevered electrode that extends toward the second web portion so that a second space formed between the second pair of flanges is interposed between the second web portion and the second cantilevered electrode.

5. The system of claim 1, where the channel-shaped electrode is supported at the web portion.

6. The system of claim 1, where the channel-shaped electrode is supported at one of the pair of flanges.

7. The system of claim 1, where the cantilevered electrode has a fin shape.

8. The system of claim 1, where the channel-shaped electrode includes an insulating layer coating a portion of the electrode facing the space formed between the flanges.

9. The system of claim 1, where either one or both of the pair of flanges includes plasma gas distribution pass-through openings.

10. A system for depositing a thin film on a flexible substrate, comprising:
    a first zone supplied with a first precursor gas when the system is in use;
    a second zone supplied with a second precursor gas when the system is in use;
    a third zone supplied with a third precursor gas when the system is in use, the third zone including a series of flow-restricting passageways opening into the first zone and second zone and arranged to provide a pathway along which a flexible substrate is threaded so that, when the system is in use, the flexible substrate is exposed to the first precursor gas in the first zone, the second precursor gas in the second zone, and the third precursor gas in the third zone;
    a plasma generator positioned in a gap formed between adjacent flow restricting passageways along the pathway within the third zone to generate radicals of the third precursor gas that are reactive with an amount of the first precursor gas, the second precursor gas, or combinations thereof, previously adsorbed to the flexible substrate upon exposure to the first precursor zone and second precursor zone, respectively, the plasma generator including two electrodes that are electrically isolated from one another and that extend toward one another in planes paralleling a portion of the pathway in the third zone, a first of the two electrodes including a pair of electrically connected conductors spaced apart from one another and positioned on either side of a conductor included in a second of the two electrodes so that one of the conductors in the first electrode is positioned between the pathway and the conductor included in the second electrode;
    a power supply electrically connected with the plasma generator; and
    a substrate transport mechanism adapted to guide the flexible substrate back and forth via a plurality of turning guides, at least some of which are located in the first and second zones, between the first and second zones along the pathway and through series of flow-restricting passageways so that a surface of the flexible substrate is transported past the plasma region and exposed to the radicals when the system is in use.

11. The system of claim 10, where the first of the two electrodes has a channel shape, where the pair of electrically connected conductors is joined by a web portion, and where the second of the two electrodes is cantilevered from a support toward a space formed between the electrically connected conductors that is interposed between the web portion and the cantilevered electrode.

12. The system of claim 10, where one of the first or second electrodes functions as an anode and where the other of the first or second electrodes functions as a cathode when the system is in use.

13. The system of claim 10, where one of the first or second electrodes is electrically grounded when the system is in use.

14. The system of claim 10, further comprising a second plasma generator positioned in a second gap within the third zone between a second flow-restricting passageway and a third flow-restricting passageway.

15. The system of claim 10, where the second electrode has a fin shape.

16. The system of claim 10, where the first electrode includes an insulating layer coating a portion of each conductor facing the space formed between the conductors.

17. The system of claim 10, where either one or both of the conductors included in the first electrode includes plasma gas distribution pass-through openings.

18. A method of exposing a flexible substrate to a plasma region, the method comprising:
   introducing a first precursor gas into a first zone;
   introducing a second precursor gas into a second zone;
   introducing a third precursor gas into a third zone a third zone, the third zone including a series of flow-restricting passageways opening into the first zone and second zone and arranged to provide a pathway along which a flexible substrate is threaded such that the flexible substrate is exposed to the first precursor gas in the first zone, the second precursor gas in the second zone, and the third precursor in the third zone;
   generating radicals of the third precursor gas in a plasma region proximal to the pathway in the third region with a plasma generator positioned in a gap formed between adjacent flow restricting passageways along the pathway within the third zone, the plasma generator including a channel-shaped electrode formed from a pair of flanges joined by a web portion and a cantilevered electrode that extends toward the web portion so that a space formed between the flanges is interposed between the web portion and the cantilevered electrode, wherein the channel-shaped electrode and the cantilevered electrode extend toward one another in planes paralleling adjacent portions of the pathway along which the flexible substrate is threaded; and
   guiding the flexible substrate back and forth via a plurality of turning guides, at least some of which are located in the first and second zones, between the first and second zones along the pathway and through the series of flow-restricting passageways so that a surface of the flexible substrate is transported past the plasma region and exposed to the radicals.

* * * * *